United States Patent [19]

Balch

[11] Patent Number: 4,973,901
[45] Date of Patent: Nov. 27, 1990

[54] COMPENSATING FOR POWER OUTRAGE IN ELECTRIC ENERGY METER

[75] Inventor: Richard A. Balch, North Hampton, N.H.

[73] Assignee: General Electric Company, Somersworth, N.H.

[21] Appl. No.: 505,203

[22] Filed: Apr. 5, 1990

[51] Int. Cl.$^5$ ............... G01R 11/64; G01R 15/08; G06F 11/00
[52] U.S. Cl. ................. 324/116; 324/103 R; 324/142; 364/483
[58] Field of Search ............ 324/116, 103 R, 142; 364/483; 365/226, 228, 229

[56] References Cited

U.S. PATENT DOCUMENTS 4,591,782  5/1986  Germer ........................... 324/103 R
4,627,000  12/1986  Germer ............................... 324/116

Primary Examiner—Ernest F. Karlsen
Attorney, Agent, or Firm—R. F. Brunson; I. M. Freedman

[57] ABSTRACT

A method and apparatus for improving the timekeeping accuracy of a time of the use or demand of energy electronic register in an electric energy meter includes compensating for the absence of line frequency timing pulses for the period between the occurrence of a power outrage and the actuation of backup timekeeping resulting from the power supply filter capacitor discharge time. A timing counter counts minutes of line frequency timing signals by decrementing a counter which is also provided with the interval interrupt operating pulses of the electronic register such that in the absence of line frequency pulses the interval interrupt operating pulses are counted and added to electronic register timekeeping system after a power down mode of operation.

58 Claims, 4 Drawing Sheets

COMPENSATING FOR POWER OUTRAGE IN ELECTRIC ENERGY METER

BACKGROUND OF INVENTION

The present invention relates to electric energy meters, and more particularly to a method and apparatus for compensating for timing errors in an electronic time of use or demand energy register in the energy meter.

Electric energy meters frequently include both a watthour meter and an electronic register which provides time of use or demand of electric energy which is used for billing purposes. Since the time of use information provided by such electronic registers is used in determining customer billing, it is important that such energy meters are highly accurate, and avoid errors in the billing information. Power companies desire to level out, or average, peak energy demands by their customers, and billing rates are frequently established which charge less for energy in recognized, off-peak periods, and/or which penalize a customer, such as an industrial customer, for peaks in energy demand and consumption. Accordingly, it is important that the electronic register not only accurately measure energy consumption, but that the timekeeping provided in such electronic registers be accurate.

It is common to utilize the power line frequency to provide the primary timing signal for the electronic register since power line frequency accuracy is carefully maintained by power companies because of the many electric clocks and timers which depend on the power line frequency for timekeeping. However, a problem arises upon the failure, or outage, of electric power on the power lines providing electric power to the load being metered by the energy meter. When a power outage occurs, there is a loss of the AC power line frequency provided to the electronic register. A power fail detector is included in the electronic register to detect power outages, and to connect a carryover battery in circuit with the microprocessor to power the electronic register in the power down mode. However, the power fail detector detects the failure of the register power supply to provide DC voltage to the microprocessor. Upon a power outage the unregulated voltage across the main filter capacitor of the register power supply begins to decay as the filter capacitor discharges. When the DC voltage on the capacitor reaches a predetermined power fail threshold, a power fail interrupt signal is generated and sent to the microprocessor of the electronic register. The operation of the microprocessor is then "interrupted" and the computer enters the power down mode of operation which provides substitute timing means and backup battery power.

However, the filter capacitor of the register power supply is a large capacitor in order that the microprocessor will not respond to extremely short power outages. If the electronic register is using a minimum amount of power and the power line voltage is at a high level just before power is suddenly lost, the large filter capacitor is charged to a high level which can cause a significant delay before the capacitor discharges sufficiently to initiate the detection of a power fail interrupt. This can result in time being lost in the timekeeping function of the electronic register since timing pulses are not being supplied from the power lines during this period, and the substitute or backup timing has not yet been initiated. Such loss of timekeeping generates inaccuracies in the operation of the electronic register.

OBJECTS AND SUMMARY OF INVENTION

It is an object of the present invention to provide accurate timekeeping in an electronic register of an energy meter in the presence of power outages.

It is another object of the present invention to provide timekeeping in an electronic register of an energy meter utilizing power line frequency even in the presence of power outages while at the same time ignoring extremely short power outages.

It is yet another object of the present invention to provide improved timekeeping in an electronic register of an energy meter including timekeeping during the period between the occurrence of a power outage and the detection of the power outage by the electronic register.

In accordance with one embodiment of the present invention, timekeeping compensation is provided for a time of use or demand electronic register in an electric power meter to compensate for the time period between a power outage and the actuation of the backup timekeeping which results from the time required for the filter capacitor in the power supply to discharge to the level which actuates the power fail signal. The power line frequency, which provides the primary timekeeping signal is used to decrement a counter which provides register operating pulses. The counter is also provided with the basic interval interrupt pulses which are only counted for timekeeping purposes in the absence of the line frequency pulses. The counted operating pulses are corrected to provide a time signal for the register timekeeping system. The microprocessor of the electronic register goes into backup mode during power outages and a backup timekeeping system is used while certain functions are discontinued to conserve the backup power. Upon the resumption of power on the power lines and catchup, timing power usage is monitored and the time of power outage including the compensated time for the delay in actuation of the power fail signal is added to the timekeeping system, after which the electronic register is reset for normal operation. The power fail detector includes a biased zener diode to establish a predetermined voltage which is used to connect backup battery power and backup timekeeping when the output voltage of the power supply falls below the predetermined voltage. The time of connection of the backup battery is recorded and displayed.

DRAWINGS AND BRIEF DESCRIPTION OF INVENTION

Figure 1:
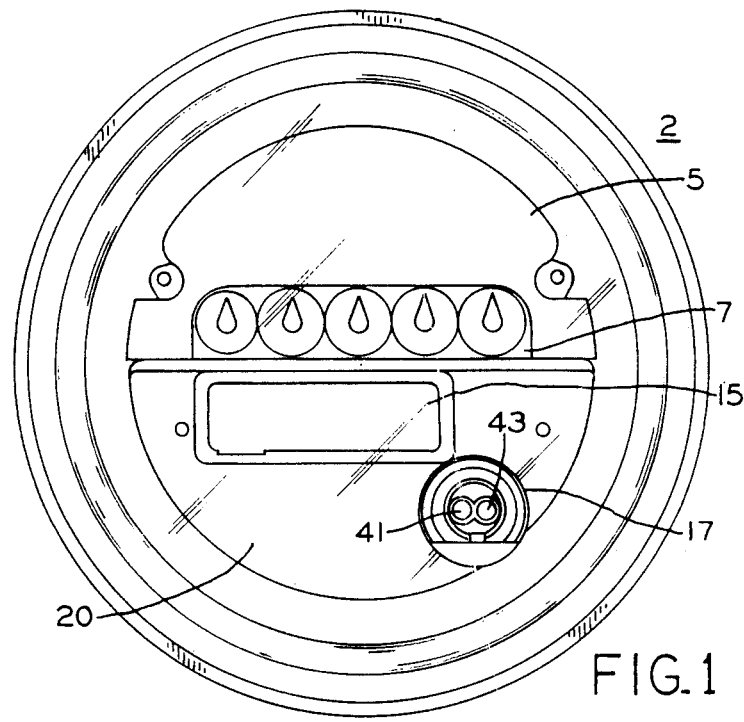
FIG. 1 is a front view of an energy meter incorporating the present invention.
Figure 2:
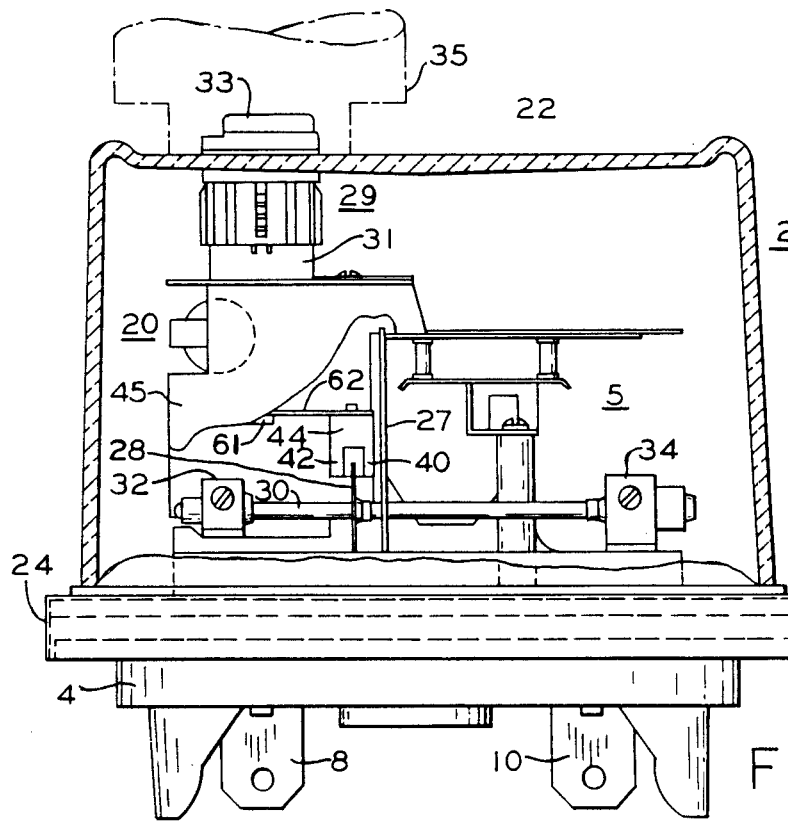
FIG. 2 is a side view of the energy meter of FIG. 1.

Referring to FIGS. 1 and 2, an electric energy or power meter 2 is shown in simplified form, and includes a base 4 having a plurality of meter circuit terminals such as 8 and 10 extending through the base to connect the meter in circuit with a power source and a load which is to be metered. An electronic register assembly 20 is positioned remote from the base 4 and meter circuit terminals 8 and 10. The internal electronics and mechanism of the energy meter 2 are enclosed by a transparent cover or enclosure 22 which is secured to the base 4 by a locking ring 24. The details of an energy meter suitable for use with the present invention are described in copending United States application Ser. No. 505,195 of A. A. Keturakis, S. D. Velte, J. G. Russillo, Jr., and R. A. Balch, and the copending patent applications referenced therein, which are assigned to the same assignee as the present invention and are hereby incorporated by reference.

In a manner well known in the art, the eddy current disk 27 on shaft 30 is caused to rotate within bearings 32 and 34 at a speed proportional to the electric energy provided to, and consumed by, the load to which the electric energy meter 2 is connected through circuit terminals such as 8 and 10, and the watthour meter 5 integrates the revolutions of the eddy current disk as a measure of power consumption. A circular shutter disk 28 is also supported on shaft 30 for rotation with eddy current disk 27.

The electric energy meter 2 in addition to the induction watthour meter 5 with a dial read out assembly 7, includes an electronic register assembly 20. The electronic register 20 includes a liquid crystal display 15 and an optical coupler 33 which is part of the optical communications port 29.

The optical communications port 29 is provided to optically connect the electronic register 20 to the outside of the energy meter 2. As shown in FIG. 2, the optical communications port 29 includes a shroud assembly 31 between the electronic register assembly 20 and transparent cover 22, and an optical coupler 33 positioned outside, and passing through, the cover to provide an optical connection from outside the cover to the optical electronic register 20 of the energy meter 2. A meter reader during periodic readings, such as once a month, positions an optical reader, shown generally as 35, over the optical coupler to read the output of register assembly 20, and if required, to program, or reprogram the register time of use periods. The output of the register assembly 20 is stored in the optical reader, and subsequently downloaded into a computer at the office of the power company for billing and analysis purposes. As shown in FIG. 1, a light emitter 41 and light detector 43 positioned within a cavity 17 of enclosure 45 of register assembly 20 provide the optical interface between the optical reader 35 positioned over the optical coupler 33 and the optical electronic circuitry of the register assembly. The details of the optical communications port 29 are described in copending United States patent application Ser. No. 505,970 filed by A. A. Keturakis and S. D. Velte, assigned to the same assignee as the present invention, and hereby incorporated by reference. For a description of the disk sensing optics 44 and the pulsing of the emitter/detector pairs included in the disk sensing optics, see copending United States patent applications, Ser. No. 505,199 of R. A. Balch, and Ser. No. 505,194 of A. A. Keturakis, R. A. Balch, and S. D. Velte, both of which are assigned to the same assignee as the present invention, and are hereby incorporated by reference.

Figure 3:
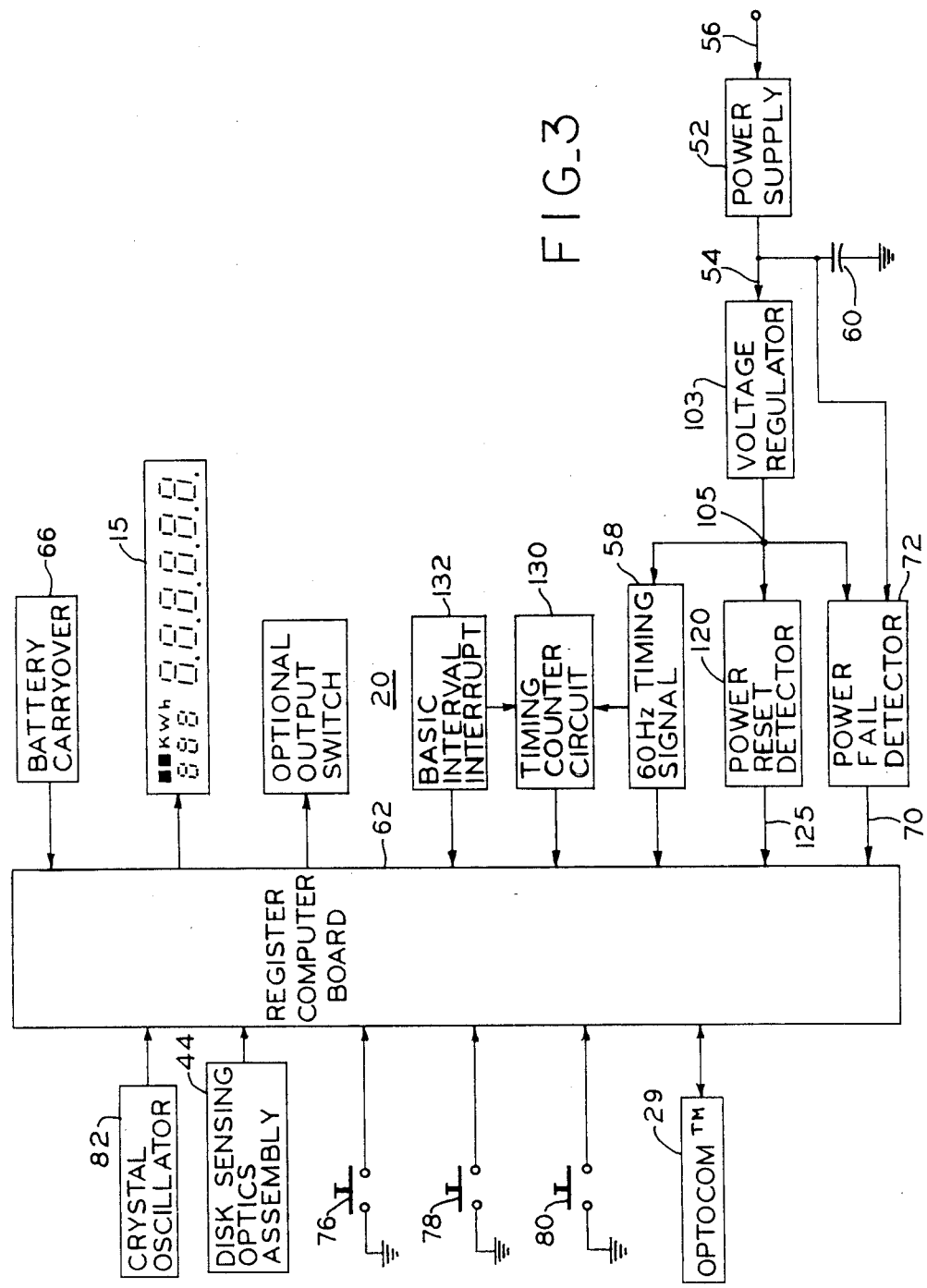
FIG. 3 is a simplified block diagram illustrating one embodiment of the invention.

Referring next to FIGS. 2 and 3. The electronic register 20 includes the register computer board 62 which contains a ROM memory, a RAM memory and the central processing unit or microprocessor 61. A plurality of inputs are provided to the microprocessor 61 on the register computer board 62 including the output of the disk sensing optics assembly 44 which provides pulses responsive to the rate of energy consumed by the load being metered, and inputs from the optical coupler 29.

Figures 4, 6:
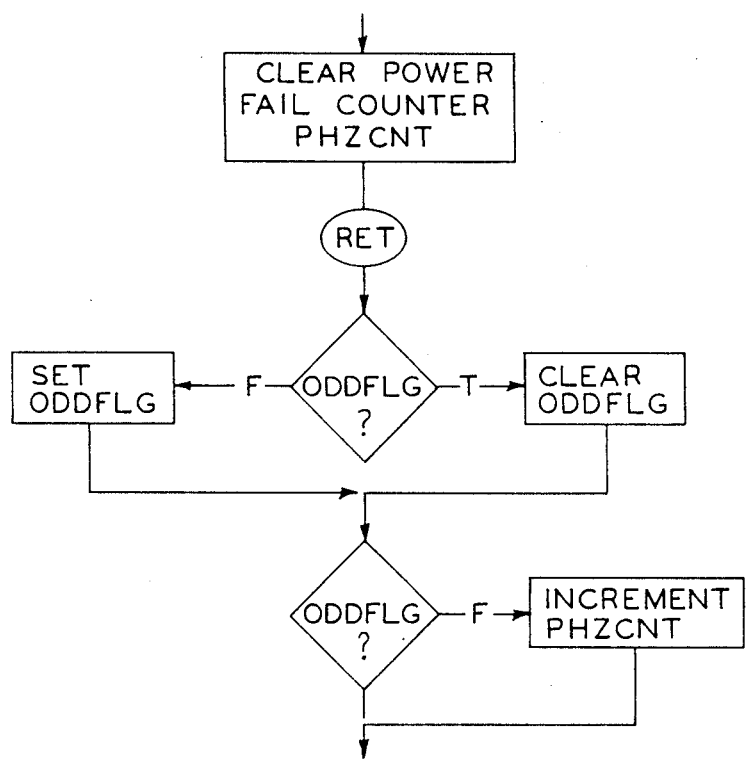
FIG. 4 is a schematic showing of the unregulated power supply of FIG. 3.
FIG. 6 is a block diagram useful in explaining the timekeeping compensation used for power line outages in accordance with the present invention.

As shown in FIG. 4, the unregulated power supply 52 includes an input transformer 88 supplied by the AC power lines 56 to the primary winding 90. A diode bridge 93 including diodes 94, 96, 98, and 100 is connected across the secondary winding 92 of transformer 88. The filter capacitor 60 is connected across the power supply output voltage 54, with one side connected to ground 102, to provide filtering and also to maintain the electronic register DC power during brief power outages. Power supply 52 thus supplies DC power 54 to the register computer board 62, and receives electrical energy from the AC power lines 56 from which the load being metered obtains electric energy. The power supply 52 also provides a timing signal 58 to the register computer board 62, which in the case of a 60 Hertz power line 56 would be a 60 Hertz signal as indicated in FIG. 3.

Figure 5:
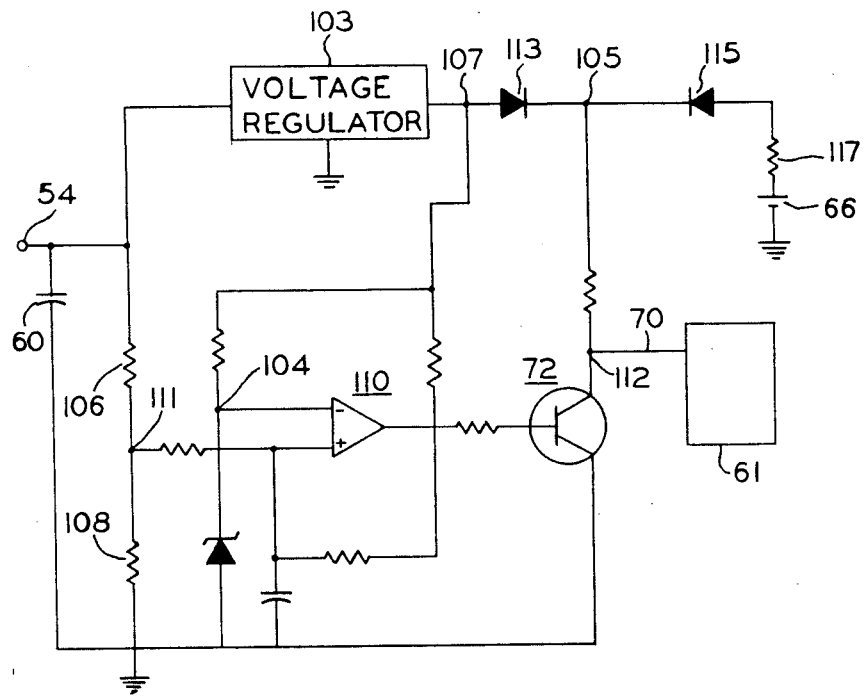
FIG. 5 is a schematic showing of the power fail detection circuit of FIG. 3.

When a power outage occurs, the unregulated voltage across the filter capacitor 60 of the register power supply 52 begins to decay. When the DC voltage on the capacitor 60 reaches the predetermined or preset power fail threshold, a power fail interrupt signal is provided to the register computer board 62 by the power fail detector 72. The power fail detector circuit 72 is shown in FIG. 5. Referring to FIG. 5, the power fail detector circuit 72 monitors the unregulated supply voltage 54 from the power supply 52. The voltages 105 and 107 are provided from the voltage regulator 103 connected in series with the output 54 of the power supply 52. When the threshold voltage 111 established by the ratio of the resistors 106 and 108 drops below the reference value established by a zener diode 113, comparator 110 will go low causing transistor 112 to turn off, sending a power fail signal 70 to the microprocessor 61 and interrupting the microprocessor to send it into the power down mode of operation.

The power supply capacitor 60 thus discharges until the regulated logic supply voltage 105 which typically is at 5 volts, drops to the level where the power fail detector 72 is actuated. This discharge time and delay can be in the order of a second or seconds for each power outage, and this delay is compensated for as described below. The carry over battery 66 is connected to provide power for the electronic register 20 during the power down mode of operation. The carry over battery 66 is a non-rechargeable single-cell lithium battery, and is normally isolated from the 5 volt regulated power supply voltage 105 by a reverse-biased diode. When the regulated power supply 105 drops below the voltage of the carry over battery 66, its isolating diode becomes forward biased and the carry over battery is connected to power the electronic register 20. The carry over battery 66 is sufficient to maintain all data stored in the RAM memory of the microprocessor 61 and also maintain power down operation of the microprocessor.

In the power down mode of operation, the microprocessor 61 "shuts down" operation to conserve power, and the liquid crystal display 15 is turned off. Because the programmable output switch is a latching type relay, it retains its last state. While in the power down mode of operation, the microprocessor 61 maintains power outage time and monitors the power line 56 to determine if power has been restored. During power outages and power down operation, no switch inputs from demand reset switch 76, display switch 78 or test switch 80 is recognized, and no display action is displayed by the liquid crystal display 15, and no output activity occurs. Outage timekeeping is done, using the crystal oscillator 82 input to the microprocessor 61 as the secondary time base during such extended power outages. The normal frequency of the crystal oscillator, as determined by its crystal is 32,768 Hertz.

When the power fail signal 70 goes low the microprocessor 61 recognizes that power has been restored, and the microprocessor "starts up." The microprocessor 61 must then bring the clock and calendar up to date, since only elapsed time was accumulated during the power outage. All of the checks of the time of use schedules, programmable dates, and similar data are accomplished in the same manner as in real time operation. Display function at liquid crystal display 15 and output functions are not provided during this "catch up" period. When all the time accumulated during the power outage as described below is added to the register clock, the microprocessor 61 is then caught up to the current time. At this time, the electronic register 20 will be at the proper date and time, the season and time of use date will be updated to the current schedule, and the electronic register 20 will begin its normal mode of operation.

The "catch up" period takes approximately one-half second per hour of power outage. After a two-day power outage, for example, the electronic register 20 could take about as long as 24 seconds to "catch up." During this time, the electronic register 20 will display all 8's as shown in FIG. 3 and not respond to the reset switch 76, display switch 78, or to the programmer. However, the electronic register 20 does count 60 Hertz pulses and also counts input signals or input pulses from the disk sensing optics assembly 44 representing energy consumption by the load being metered during the "catch up" period. A fast "catch up" method is used for power outages lasting more than one day, allowing 90 days of power outage time to be "caught up" in about 30 seconds.

The number of minutes the electronic register 20 was on battery carryover 66 is added to the cumulative total of time on battery carryover and is selectable for display. Time on battery carryover is maintained as an aid in determining the expected useful life of the battery 66 and when the battery should be replaced. Time on carryover can be reset to zero with the Register Programmer each time a new battery is installed.

As mentioned above in a number of contexts, one of the most important functions of the electronic register 20 is to keep time. The primary time base is the 60 Hertz input 56 which is used for the clock and calendar functions of the electronic register 20. This is accomplished by having the 60 Hertz timing signal 58 interrupt the microprocessor 61, causing the microprocessor to recognize that another 1/60th of a second has passed. When 3,600 interrupts (on 60 Hertz operation) have occurred, one minute has passed and the clock time is updated. At each quarter hour, the time of use schedule is checked to determine if a time of use rate change should occur, or if a load control action should be activated. Every four quarter hours, the hour is updated. The time display encompasses 00 through 23 hours and 00 through 59 minutes with 00 hours and 00 minutes being midnight. Every midnight, when the day changes, it is checked to determine if it was the last day of the month and, if required, will change the date to the first day of the following month. The date is displayed in a six-digit format such as day/month/year. The last day of the month is determined from a table stored in the ROM memory and February 29th is added every four years, on leap year.

In addition, the time of use or demand register 20 accurately programs in season changes, holidays and daylight saving time since billing is frequently dependent upon such factors.

It is thus apparent that accurate billing is dependent on accurate time keeping. The electronic register, for example, will record the date and time of the maximum energy demand by the load being metered as well as the five highest demands which are independent of the time of use or discounted periods.

However, the filter capacitor 60 at the output of the power supply 52 is necessarily of a large capacitance in order that it will not respond to extremely short or momentary power outages. Relatively short power outages of the type which may cause lights to flicker, or dim momentarily, and which are frequently encountered, for example during electrical storms, do not interrupt the operation described above; that is, they do not cause the actuation of power fail detector 72, the take over by carry over battery 66, the power down mode of operation of the microprocessor 61, and backup timekeeping utilizing crystal oscillator 82, as described above. Instead, capacitor 60 maintains operating power during such momentary power outages.

However, particularly if the power consumption by the electronic register 20 is at a minimum or low value, and if the AC line voltage on the power lines 56 is at a high level just before a power outage which is longer than the momentary type, there may be a relatively long delay before the electronic register 20 recognizes the power outage, and this delay will result in the electronic register losing time. The capacitor 60 under such conditions will maintain a power on condition by maintaining the power supply output 54 at a level above that which will activate power fail detector 72. During this time, the 60 Hertz timing signal circuit 58 is not receiving an input, and time will be lost during the period it takes for the capacitor 60 to discharge adequately for the power fail detector 72 to detect the presence of a power outage. The operation of the present invention to compensate for that period of time is illustrated by way of the block diagram in FIG. 5 and the explanation of its operation may be assisted by the algorithm set forth below, which is included for completeness of description.

ALGORITHM:

START Basic Interval Interrupt toggle odd count bit (ODDFLG)
    IF odd count bit is clear
        increment internal counter (PHZCNT)

```
                ENDIF
        END BASIC Interval interrupt
                *
                *
        START 60 Hertz Interrupt
                *
                zero PHZCNT
        END 60 Hertz Interrupt
                *
                *
                *
        START Power Fail Interrupt
                *
        REPEAT
                turn off main clock
                REPEAT
                        switch to HALT mode
                        sleep for one half second until watch mode interrupt
                        add one half second's hertz count to hertz count (PHZCNT)
                        IF PHZCNT > = hertz per minute (CPMNUM)
                                subtract one minute's hertz count from PHZCNT
                                increment power down minute counter (PMNREG)
                        ENDIF
                UNTIL power is on
                        *
                        *
                IF PHZCNT > = hertz per minute (CPMNUM)
                        subtract one minute's hertz count from PHZCNT
                        increment power down minute counter (PMNREG)
                ENDIF
                turn on main clock
                UNTIL power is still on
                        *
                        *
                subtract elapsed hertz count (PHZCNT) from hertz count
(HRZCNT)
                IF HZCNT < = 0
                        add cycles per minute (CPMNUM) to HRZCNT
                        increment elapsed minutes (PMNREG)
                ENDIF
                        *
        END Power Fail Interrupt
```

Referring to the algorithm above and to FIG. 5, time is kept for performing the various timing functions described above by monitoring the line frequency 56 through the 60 Hertz timing signal 58 and generating an interrupt for every line frequency cycle, that is, for every 16 ⅔ milliseconds at 60 Hertz. However, the basic interval interrupt or operating pulses utilized in the electronic register 20 during which the emitter/detector pairs in disk sensing optics assembly 44 are pulsed is 7.8125 milliseconds, or slightly more than twice as fast as the line frequency. The basic interval interrupt frequency is provided by the primary system oscillator which oscillates at 4.194 Megahertz. Time is kept by monitoring the power line frequency and generating an interrupt for every line frequency cycle and decrementing a timing counter circuit (HRZCNT) 130. When HRZCNT 130 reaches zero it is set to the number of cycles in one minute 3,600 (CPMNUM) and the system time is incremented by one minute, that is one minute is added to the timekeeping of electronic register 20.

The basic interval interrupt 132 is used to account for the time which would be lost between a power outage and actuation of power fail detector 72. To account for this time, an internal counter (PHZCNT) is used and read only when a power outage occurs. The adjusted time will be fast because the basic interval timer is approximately 6.6% faster than the 60 Hz line frequency. When a register starts for the first time, PHZCNT will be set to zero. PHZCNT is then incremented every other time the basic interval interrupt is entered. Every time the line frequency interrupt is entered PHZCNT is cleared. Because the basic interval and the 60 Hz interrupts are asynchronous, the next odd count will occur between 0.0 ms and 15.625 ms after the 60 Hz interrupt occurs.

When a power fail is detected, PHZCNT is used to keep track of the time during the power outage. The register "wakes up" every ½ second and 30 (cycles) is added to PHZCNT. If PHZCNT is greater than or equal to CPMNUM, CPMNUM is subtracted from PHZCNT and the number of minutes accumulated during the present power outage (PMNREG) is incremented. When the power outage is completed, PHZCNT is used to adjust HZCNT 130 and PMNREG.

While the present invention has been described for use with 60 Hertz power lines, it is equally applicable to other power line frequencies, such as 50 Hertz, by adjustment of the timers or counters and the algorithm to 50 cycle operation.

Thus, while the present invention has been described through preferred embodiments, such embodiments are provided by way of example only. Numerous variations, changes and substitutions, including those discussed above will occur to those skilled in the art without departing from the scope of the present invention in the following claims.

What I claim is:

1. In an electric energy meter including an electronic time of use or demand of energy register adapted to be connected in circuit with power lines to meter the energy being consumed at predetermined times by a load in circuit with the power lines, a timekeeping system utilizing the power line frequency for timekeeping purposes, and a power supply energized by the power lines to provide DC power to electronic circuitry of the electronic register and including a capacitor which maintains the DC power during brief power outages, a method of compensation for line frequency timing during the time period of the start of a power outage until the electronic register shifts from power line timing operation to backup timekeeping operation comprising:

providing a power fail detector circuit which is actuated when the output voltage from said power supply falls below a predetermined value;

generating a power fail control signal upon actuation of said power fail detector circuit;

connecting backup power and backup timekeeping in circuit with said electronic register in response to said power fail control signal; and providing timing compensation for the time period between the occurrence of a power outage and the generation of a power fail control signal;

said timing compensation including pulsing a counter with the basic interval interrupt of said electronic register and line frequency pulses;

periodically providing the output of said counter to the timekeeping system of said electronic register, said output being the line frequency pulses during the presence of line frequency pulses;

counting the basic interval interrupt pulses which occur during the period of a power outage until actuation of said power fail detector circuit without the presence of line frequency pulses; and adding time to said timekeeping for said electronic register based on the basic interval interrupt pulses counted during said period between a power outage and actuation of said power fail detector circuit.

2. The method of timekeeping compensation for an electronic register in an electric energy meter of claim 1 including the additional step of returning said counter to its initial state upon each addition of a predetermined time period to said timekeeping system.

3. The method of timekeeping compensation for an electronic register in an electric energy meter of claim 2 including the additional step of providing a frequency factor to relate the frequency of said basic interval interrupt signal to said line frequency.

4. The method of timekeeping compensation for an electronic register in an electric energy meter of claim 3 wherein said frequency factor is provided by dividing the basic interval interrupt pulses which are counted by two.

5. The method of timekeeping compensation for an electronic register in an electric energy meter of claim 4 including the additional step of providing a correction factor to account for the difference between the frequency of said basic interval interrupt signal and said line frequency.

6. The method of timekeeping compensation for a electronic register in an electric energy meter of claim 5 wherein said basic interval interrupt signal is in the order of 7.8125 milliseconds, said line frequency is nominally 60 Hertz, and said correction factor is an amount adequate to correct for said counter being in the order of 6.25 percent fast.

7. The method of timekeeping compensation for an electronic register in an electric energy meter of claim 1 wherein said power fail detector includes a biased zener diode to establish said predetermined value of voltage, and when the output voltage from said power supply falls below said predetermined value, said power fail control signal connects a backup oscillator in circuit with said electronic register to provide said backup timekeeping during said power outage.

8. The method of timekeeping compensation for an electronic register in an electric energy meter of claim 7 wherein said backup power is a battery operatively connected in circuit with said electronic register in response to said power fail control signal, and said electronic register maintains a record of the period of time said battery is operatively connected in circuit with said electronic register during power outages.

9. The method of timekeeping compensation for an electronic register in an electric energy meter of claim 8 including the additional step of displaying said record of the period of time said battery is operatively connected in circuit with said electronic register upon presentation of a battery command signal to said electronic register.

10. The method of timekeeping compensation for an electronic register in an electric energy meter of claim 1 wherein said power supply includes a filter capacitor and said filter capacitor is selected to be of sufficiently large capacitance that said power supply voltage remains above said predetermined voltage during momentary power outages.

11. The method of timekeeping compensation for an electronic register in an electric energy meter of claim 10 wherein said time compensation is provided for the actuation period of time between the occurrence of a power outage and the discharge of said filter capacitor to said predetermined voltage.

12. The method of timekeeping compensation for an electronic register in an electric energy meter of claim 11 wherein said power fail control signal sets the microprocessor of said electronic register in a power down mode of operation to maintain unread energy data already in said electronic register, to continue timekeeping, and to monitor the power line to detect the restoration of line power.

13. The method of timekeeping compensation for an electronic register in an electric energy meter of claim 12 including the additional step of resuming normal operation of said electronic register and discontinuing said power down mode of operation when restoration of line power is detected.

14. The method of timekeeping compensation for an electronic register in an electric energy meter of claim 13 wherein resuming normal operation of said electronic register includes adding the time of the power outage and the actuation period to the timekeeping system of said electronic register.

15. The method of timekeeping compensation for an electronic register in an electric energy meter of claim 14 wherein the electronic register activity is discontinued during said power down mode along with the discontinuance of register displays in response to register switching action.

16. The method of timekeeping compensation for an electronic register in an electric energy meter of claim 15 wherein upon restoration of power on said power lines, the timekeeping functions of said electronic register are caught up during a catch up period, and the electronic register output and register displays in response to register switching action are discontinued during said catch up period.

17. The method of timekeeping compensation for an electronic register in an electric energy meter of claim 16 wherein signals representing energy consumption during said catch up period are added to the energy consumption being metered.

18. The method of timekeeping compensation for an electronic register in an electric energy meter of claim 17 wherein said backup timekeeping during said power down mode of operation is provided by a crystal oscillator, said crystal oscillator being connected in circuit with said electronic register upon said generation of a power fail control signal.

19. In an electric energy meter including an electronic time of use or demand of energy register adapted to be connected in circuit with power lines to meter the energy being consumed at predetermined times by a load in circuit with the power lines, a timekeeping system utilizing the power line frequency for timekeeping purposes, and a power supply energized by the power lines to provide DC power to electronic circuitry of the electronic register and including a capacitor which maintains the DC power during brief power outages, a method of providing a power down mode of operation during a period of power outage on said power lines, comprising:
   generating a power fail signal upon detection of said power outage by a power fail circuit;
   connecting backup timing means and backup power in circuit with said electronic register in response to said power fail signal;
   setting said electronic register in a power down mode of operation to conserve said backup power during said power down mode of operation;
   maintaining said timekeeping based on said backup timing means during said power down mode of operation;
   generating a timing signal in response to the time period between said power outage and the connection of said backup timing means;
   discontinuing at least some of the normal functions of said electronic register during said power down mode of operation;
   catching up said timekeeping system through use of said timing signal; and
   discontinuing said power down mode of operation and resuming normal operation of said electronic register upon resumption of power on said power lines.

20. The method of operating an electronic register in a power down mode of operation during power outages of claim 19 wherein the generating of said timing signal includes the use of a timing counter which counts those operating pulses of said electronic register which exceed line frequency pulses from said power lines such that said timing counter effectively only counts timing pulses in the absence of line frequency pulses.

21. The method of operating an electronic register in a power down mode of operation during power outages of claim 20 wherein said timing counter is a decrementing counter which is periodically zeroed as long as line frequency pulses are provided to offset said operating pulses.

22. The method of operating an electronic register in a power down mode of operation during power outages of claim 21 wherein said operating pulses are the basic interval interrupt period pulses used to establish the timing periods during a portion of which the optical system of said electronic register is energized, and said operating pulses are continued independent of power on said power lines.

23. The method of operating an electronic register in a power down mode of operation during power outages of claim 22 wherein said operating pulses are counted for timekeeping purposes during the period between failure of line frequency to said timing counter and the provision of backup timing in response to said power fail signal.

24. The method of operating an electronic register in a power down mode of operation during power outages of claim 23 including the additional step of providing a time factor to more closely relate said operating pulses to said line frequency.

25. The method of timekeeping compensation for an electronic register in an electric energy meter of claim 24 wherein said time factor is provided by dividing the number of operating pulses which are counted by two to provide substitute line frequency pulses and utilizing said substitute line frequency pulses as part of said timekeeping system.

26. The method of timekeeping compensation for an electronic register in an electric energy meter of claim 25 including the additional step of providing a correction factor to account for the asynchronous difference between the frequency of said operating pulses and said line frequency.

27. The method of timekeeping compensation for an electronic register in an electric energy meter of claim 26 wherein said operating pulses are in the order of 7.8125 milliseconds, said line frequency is nominally 60 Hertz, and said correction factor is an amount adequate to correct for said counter being in the order of 6.25 percent fast.

28. The method of timekeeping compensation for an electronic register in an electric energy meter of claim 27 wherein said power fail detector includes a biased zener diode to establish said predetermined value of voltage; and when the output voltage from said power supply falls below said predetermined value, said power fail control signal connects a backup oscillator in circuit with said electronic register to provide said backup timekeeping during said power outage.

29. The method of timekeeping compensation for an electronic register in an electric energy meter of claim 28 wherein said backup power is a battery connected in circuit with said electronic register in response to said power fail control signal, and said electronic register maintains a record of the period of time said battery is connected in circuit with said electronic register during power outages.

30. The method of timekeeping compensation for an electronic register in an electric energy meter of claim 29 including the additional step of displaying said record of the period of time said battery is connected in circuit with said electronic register upon presentation of a battery command signal to said electronic register.

31. The method of operating an electronic register in a power down mode of operation during power outages of claim 19 wherein said power supply includes a filter capacitor and said filter capacitor is selected to be of sufficiently large capacitance that said power supply voltage remains above said predetermined voltage during momentary power outages.

32. The method of timekeeping compensation for an electronic register in an electric energy meter of claim 31 wherein said time compensation is provided for the period of time between the occurrence of a power outage and the discharge of said filter capacitor by power delivered to said electronic register to said predetermined voltage.

33. The method of timekeeping compensation for an electronic register in an electric energy meter of claim 32 wherein said power fail control signal sets the microprocessor of said electronic register in said power down mode of operation to maintain unread energy data already in said electronic register, to continue timekeeping, and to monitor the power line to detect the restoration of line power.

34. The method of timekeeping compensation for an electronic register in an electric energy meter of claim 33 including the additional step of resuming normal operation of said electronic register from said power down mode of operation when restoration of line power is detected.

35. The method of timekeeping compensation for an electronic register in an electric energy meter of claim 34 wherein resuming normal operation of said electronic register includes adding the time compensation to the timekeeping system of said electronic register.

36. The method of timekeeping compensation for an electronic register in an electric energy meter of claim 35 wherein said power down mode the electronic register activity is discontinued along with the discontinuance of register displays in response to register switching action 37. The method of timekeeping compensation for an electronic register in an electric energy meter of claim 36 wherein upon restoration of power on said power lines the timekeeping functions of said electronic register are caught up, and said electronic register output and register displays in response to register switching action remains discontinued during the catch up period.

38. The method of timekeeping compensation for an electronic register in an electric energy meter of claim 37 wherein signals representing energy consumption on the power lines being metered during said catch up period are added to the energy consumption already metered.

39. The method of timekeeping compensation for an electronic register in an electric energy meter of claim 38 wherein said backup timekeeping during said power down mode of operation is provided by a crystal oscillator, said crystal oscillator being connected in circuit with said electronic register upon said generation of a power fail control signal.

40. In an electric energy meter including an electronic time of use or demand of energy register adapted to be connected in circuit with power lines to meter the energy being consumed at predetermined times or periods by a load in circuit with the power lines, a timekeeping system utilizing the power line frequency for primary timekeeping purposes, and a power supply energized by the power lines to provide DC power to electronic circuitry of the electronic register, a power down mode of operation for said electronic register in the presence of power outage on said power lines comprising:
 a power fail detector circuit which is actuated to provide a power fail control signal when the output voltage from said power supply falls below a predetermined value;
 said power supply including a filter capacitor in its output circuit which tends to maintain power to said electronic register upon momentary power outages such that the response of said power fail detector circuit may be delayed due to the charge on said filter capacitor;
 backup power and backup timekeeping connected in circuit with said electronic register upon actuation of said power fail detector circuit;
 timekeeping compensation means to add time to said timekeeping system proportional to the actuation period between a power outage and actuation of said power fail detector circuit;
 said timekeeping compensation means including a timing counter circuit which is provided with the operating pulses for said electronic register;
 said timing counter circuit counting said operating pulses during the actuation period of said power outage to the actuation of said backup timekeeping;
 a power restoration detection circuit to provide a power restoration signal upon resumption of power on said power lines to discontinue said power down mode of operation; and
 means to add the operating pulses counted during said actuation period to the timekeeping system of said electronic register.

41. The time compensated power down system in an electronic time of use or demand energy register of claim 40 wherein said timing counter circuit is decremented by the line frequency pulses such that the timing counter circuit is repeatedly cleared in the presence of line frequency pulses.

42. The time compensated power down system in an electronic time of use or demand energy register of claim 41 wherein said operating pulses and said line frequency pulses are asynchronous.

43. The time compensated power down system in an electronic time of use or demand energy register of claim 42 wherein said operating pulses are in the order of twice the frequency of said line frequency pulses.

44. The time compensated power down system in an electronic time of use or demand energy register of claim 43 wherein a divider divides said operating pulses by two before said operating pulses are added to the timekeeping system of said electronic register.

45. The time compensated power down system in an electronic time of use or demand energy register of claim 44 wherein a correction factor is provided to compensate for the asynchronous difference between said operating pulses and said line frequency pulses.

46. The time compensated power down system in an electronic time of use or demand energy register of claim 45 wherein said operating pulses are said basic interval interrupt signal and are in the order of 7.8125 milliseconds, said line frequency is nominally 60 Hertz, and said correction factor is an amount adequate to correct for said timing counter circuit being in the order of 6.6 percent fast when counting said operating pulses during said actuation period.

47. The time compensated power down system in an electronic time of use or demand energy register of claim 40 wherein said power fail detector includes a biased zener diode to establish said predetermined value of voltage such that when the output voltage from said power supply falls below said predetermined value, said power fail detector provides a power fail control signal to connect a backup oscillator in circuit with said electronic register to provide backup timekeeping during said power outage.

48. The time compensated power down system in an electronic time of use or demand energy register of claim 47 wherein said power fail control signal connects a backup power battery in circuit with said electronic register in response to a power outage, and said electronic register includes means to maintain a record of the period of time said battery is connected in circuit with said electronic register during power outages.

49. The time compensated power down system in an electronic time of use or demand energy register of claim 48 including means to display said record of the period of time said battery is connected in circuit with said electronic register upon presentation of a battery command signal to said electronic register.

50. The time compensated power down system in an electronic time of use or demand energy register of claim 40 wherein said power supply includes a filter capacitor of sufficiently large capacitance that said power supply voltage remains above said predetermined voltage during momentary power outages.

51. The time compensated power down system in an electronic time of use or demand energy register of claim 50 wherein said time compensation is counted and provided for the period of time between the occurrence of a power outage and the discharge of said filter capacitor to said predetermined voltage.

52. The time compensated power down system in an electronic time of use or demand energy register of claim 51 wherein said power fail control signal is provided to the microprocessor to set said electronic register in a power down mode of operation to maintain unread energy data already in said electronic register, to continue timekeeping, and to monitor the power line to detect the restoration of line power.

53. The time compensated power down system in an electronic time of use or demand energy register of claim 40 including means to detect restoration of line power to resume normal operation of said electronic register and discontinue said power down mode of operation.

54. The time compensated power down system in an electronic time of use or demand energy register of claim 53 wherein resuming normal operation of said electronic register includes means to add the time of the power outage and the time of said actuation period to the timekeeping system of said electronic register.

55. The time compensated power down system in an electronic time of use or demand energy register of claim 54 wherein means are provided to discontinue electronic register activity during said power down mode along with the discontinuance of register displays in response to register switching action.

56. The time compensated power down system in an electronic time of use or demand energy register of claim 55 wherein upon restoration of power on said power lines, the timekeeping functions of said electronic register which are restored and caught up during a catch up period, and said electronic register output and register displays in response to register switching action remain discontinued during said catch up period.

57. The time compensated power down system in an electronic time of use or demand energy register of claim 56 wherein means are provided to add signals representing energy consumption during said catch up period to the energy consumption being metered.

58. The time compensated power down system in an electronic time of use or demand energy register of claim 57 wherein a crystal oscillator is provided for backup timekeeping during said power down mode of operation, said crystal oscillator being connected in circuit with said electronic register upon the provision of said power fail control signal.

* * * * *